United States Patent [19]

DeWitt

[11] Patent Number: 5,084,638

[45] Date of Patent: Jan. 28, 1992

[54] DRIVER CIRCUIT WITH CONTROLLED OUTPUT DRIVE SIGNAL CHARACTERISTICS

[75] Inventor: Barnard C. DeWitt, Austin, Tex.

[73] Assignee: Motorola, Inc., Schaumburg, Ill.

[21] Appl. No.: 666,963

[22] Filed: Mar. 11, 1991

[51] Int. Cl.$^5$ .................. H03K 19/096; H03K 17/693
[52] U.S. Cl. ..................................... 307/481; 307/582
[58] Field of Search ............... 307/269, 448, 451, 452, 307/453, 480, 481, 582

[56] References Cited

U.S. PATENT DOCUMENTS

| | | | |
|---|---|---|---|
| 4,469,962 | 9/1984 | Snyder | 307/582 X |
| 4,649,299 | 3/1987 | Yamanouchi | 307/481 X |
| 4,760,281 | 7/1988 | Takemae | 307/582 X |

Primary Examiner—Steven Mottola
Attorney, Agent, or Firm—Robert L. King

[57] ABSTRACT

A driver circuit (10) has an input portion (12) and an output portion (14). The input portion (12) receives both an enabling signal and a first clocking signal, and selectively provides an active low output signal. The output portion (14) receives both the output signal from the input portion (12) and a second clocking signal. The second clocking signal is substantially opposite in polarity from the first clocking signal. In response to receiving an active low output signal from the input portion (12), the output portion (14) provides an active high output signal at an output of the driver circuit (10). In response to receiving an active second clocking signal at an input to the output portion (14), the active high output signal at the output of driver circuit (10) is driven low.

10 Claims, 1 Drawing Sheet

DRIVER CIRCUIT WITH CONTROLLED OUTPUT DRIVE SIGNAL CHARACTERISTICS

FIELD OF THE INVENTION

This invention relates generally to electronic circuits, and more particularly, to driver circuits.

BACKGROUND OF THE INVENTION

Driver circuits that provide output clocking signals are utilized within integrated circuits. In particular, data processors have a need to control both a leading-edge and a back-edge characteristic of an output clocking signal that functions to enable circuits, transfer data, and latch data. Characteristics of an ideal output clocking signal include, but are not limited to: (1) fast leading-edge rise time; (2) fast back-edge fall time; and (3) no overlapping edges of separate output clocking signals. A fast leading-edge rise time is crucial for enabling time-critical circuits. A fast back-edge fall time and no overlapping edges of separate output clocking signals from separate driver circuits are critical in a data processing system to prevent a race condition.

A known method of providing controlled clock edge timing is with a boot-strap driver circuit. The boot-strap driver circuit works by isolating charge on a gate of a booting transistor, and an input clocking signal connected to a drain terminal of the booting transistor capacitively couples the trapped charge at the gate of the booting to a high voltage level. The high voltage on the gate allows the input clock signal, at the drain of the booting transistor, to be fully coupled to an output terminal of the boot-strap driver circuit without any voltage drop across the booting transistor. A problem with a bootstrap circuit is that an advanced semiconductor manufacturing process typically has thin gate oxides that can break down when a high voltage is applied.

Another known method of providing a controlled clocking signal within a data processor is with an inverter driven by a NAND-gate. The NAND-gate receives both an enable signal and a clock signal, and provides an output that drives an input to the inverter. An output of the inverter is the enabled clock signal. For example, a NAND-inverter combination is utilized within Motorola's commercially available 68HC000 microprocessor to generate core-driver signals and localized clocked enable signals. In systems using a plurality of clocked enabled NAND-inverter circuits, the clock edges of separate clocked enabled NAND-inverter combinations may have excessive overlapping. As mentioned above, the excessive overlapping of clock edges can lead to race conditions.

Therefore, within an integrated circuit which is required to avoid using any high-valued gate voltages (i.e. higher than the power supply voltage), controlled clocking signals that have ideal clock edge characteristics are required.

SUMMARY OF THE INVENTION

The previously mentioned requirements are fulfilled with the present invention. In one form, a driver circuit with controlled output drive signal characteristics is comprised of an input means for receiving an input enabling signal at a first control terminal, and receives a first input clocking signal. The input means selectively provides an output signal in response to both the input enabling signal and the first clocking signal. An output means is coupled to the input means for receiving both the output signal of the input means and a second input clocking signal, and provides an output drive signal in response to both the output signal of the input means and the second input clocking signal. The second input clocking signal is substantially non-overlapping with the first input clocking signal and is coupled to a second control terminal to force the output drive signal to have a predetermined logic level directly in response to the second input clocking signal.

These and other features, and advantages, will be more clearly understood from the following detailed description taken in conjunction with the accompanying drawings.

DESCRIPTION OF A PREFERRED EMBODIMENT

Figure 1:
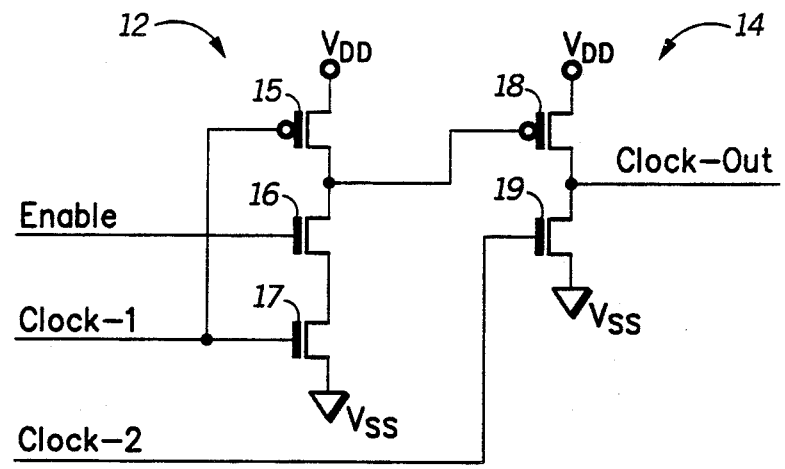
FIG. 1 illustrates in schematic diagram form a driver circuit in accordance with the present invention.

Illustrated in FIG. 1 is a driver circuit 10 in accordance with the present invention. Driver circuit 10 has an input portion 12 and an output portion 14. The input portion 12 has a P-channel transistor 15, an N-channel transistor 16, and an N-channel transistor 17. The output portion 14 has a P-channel transistor 18 and an N-channel transistor 19.

The p-channel transistor 15 has a source connected to a positive power supply labeled "Vdd," and a drain connected to both a drain of N-channel transistor 16 and a gate of P-channel transistor 18. The P-channel transistor 15 has a gate connected to both a gate of N-channel transistor 17 and an input control signal labeled "clock-1." The N-channel transistor 16 has a gate connected to an input control signal labeled "Enable," and a source connected to a drain of N-channel transistor 17. The N-channel transistor 17 has a source connected to a reference voltage terminal labeled "Vss." The P-channel transistor 18 has a source connected to Vdd, and a drain connected to both a drain of N-channel transistor 19 and an output terminal labeled "Clock-Out." The N-channel transistor 19 has a source connected to Vss, and a gate connected to an input control signal labeled "clock-2."

Figure 2:
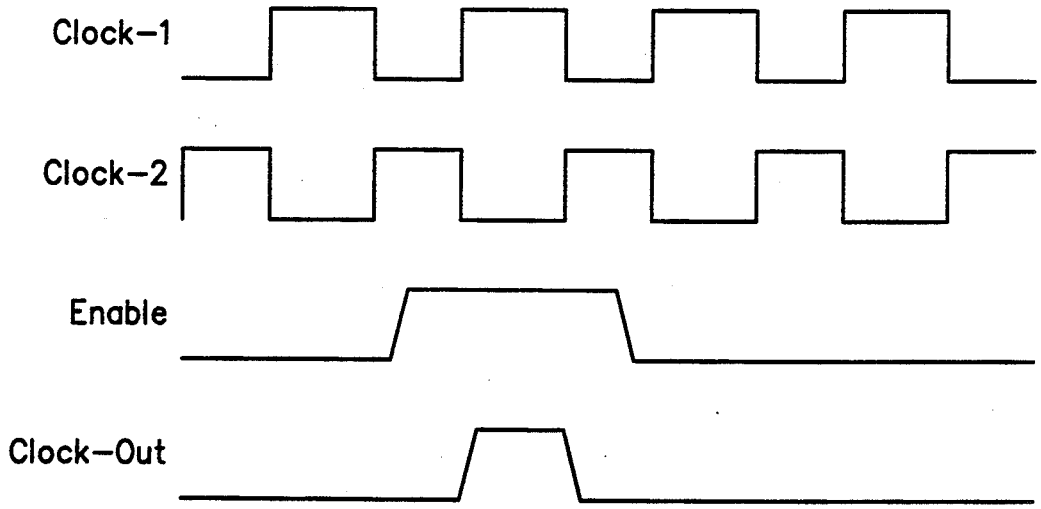
FIG. 2 illustrates in timing diagram form a timing wave form that demonstrates the present invention.

FIG. 2 illustrates a timing diagram for demonstrating a form of the present invention. The timing diagram has two repeating waveforms labeled clock-1 and clock-2. Clock-1 and clock-2 are ideally non-overlapping clocks, and clock-1 is opposite in polarity from clock-2. The timing diagram also demonstrates an enable signal, and a Clock-Out signal.

In operation, the illustrated Enable signal of FIG. 2 transitions from an inactive state to an active state during the time period that the clock-1 signal is inactive. When the Enable signal is active and the clock-1 signal transitions from the inactive state to the active state, the gate of P-channel transistor 18 is connected to Vss through n-channel transistors 16 and 17. In response to the gate of P-channel transistor 18 being low, p-channel transistor 18 drives Clock-Out to a high voltage level. When the clock-1 signal transitions from an active to an inactive state, n-channel transistor 17 is deactivated and P-channel transistor 15 is activated. In response to P-channel transistor 15 being activated, Vdd is coupled through P-channel transistor 15 to the gate of P-channel transistor 18 to deactivate P-channel transistor 18. Since clock-1 and clock-2 are opposite in polarity, as clock-1 transitions from an inactive to an active state, clock-2 transitions from an inactive to an active state. When clock-2 transitions to the active state, N-channel transistor 19 is activated, and Clock-Out is connected to Vss through N-channel transistor 19.

Figure 3:
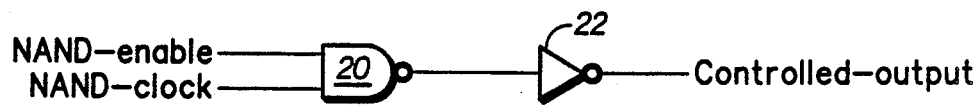
FIG. 3 illustrates in logic diagram form a prior art driver circuit.

FIG. 3 illustrates a prior art circuit for providing a controlled clocking signal. The prior art circuit has a NAND-gate 20 and an inverter 22. NAND-gate 20 has an input connected to an enabling signal labeled "NAND-enable," and a clocking input connected to a clocking signal labeled "NAND-clock." NAND-gate 20 has an output connected to an input of inverter 22. Inverter 22 has an output for providing a signal labeled "Controlled-output."

The prior art NAND-gate 20 and inverter 22 operate in the following manner. When the NAND-clock signal is inactive the NAND-enable signal becomes active. When the NAND-enable signal is activated and the NAND-clock signal becomes active, the output of inverter 22 becomes active. When either the NAND-enable or the NAND-clock signals becomes inactive, the output of inverter 22 becomes inactive. In summary, NAND-gate 20 and inverter 22 collectively perform a logical AND function.

A comparison between the prior art NAND-gate 20 and the inverter 22 of FIG. 3 to circuit 10 of FIG. 1 will further illustrate the present invention. Inverter 22 is responsive only to the output of the NAND-gate 20 whereas the output of circuit 10 is responsive to both the output of input portion 12 as well as clock-2. Further, the output of the NAND-gate 20 drives a transistor (not illustrated) within inverter 22 that pulls the output of inverter 22 up, as well as a transistor (not illustrated) within inverter 22 that pulls the output of inverter 22 low. Since the output of the NAND-gate 20 drives the transistor (not that pulls the output of inverter 22 low, the output of inverter 22 has a delayed response when compared to the output of circuit 10 of FIG. 1 which is driven low in response to an active clock-2 signal. Further, since NAND-gate 20 drives a transistor (not illustrated) that pulls the output of inverter 22 low as well as a transistor (not illustrated) that pulls the output of inverter 22 high, the output of the NAND-gate 20 has additional capacitive loading. The additional capacitive loading causes the output of NAND-gate 20 to transition more slowly. In response to the slower transition at the output of NAND-gate 20, the output of inverter 22 transitions slowly.

Another difference between circuit 10 of FIG. 1 and AND-gate 20 is a difference in area requirement necessary to implement NAND-gate 20 versus input portion 12 of circuit 10. Since NAND-gate 20 is a full complementary logic gate, NAND-gate 20 requires an additional P-channel transistor that is not required for implementing input portion 12 of circuit 10. The input portion 12 is used only to control the gate of P-channel transistor 18, and clock-2 controls the gate of the N-channel transistor 19. Since the input portion 12 of circuit 10 controls only the gate of P-channel transistor 18, transistor sizes for the input portion 12 are made smaller. Therefore, since the input portion 12 has fewer devices than NAND-gate 20, and the transistor sizes of input portion 12 are smaller, the area requirement necessary to implement input portion 12 is less.

It should be well understood that driver circuit 10 has an input portion 12 that receives an Enable signal and a clock signal, clock-1. An output of the input portion 12 is used to selectively control the gate of P-channel transistor 18. In response to the output of input portion 12, P-channel transistor 18 conditionally drives an output of the controlled driver circuit 10 high. In response to clock-2, the output of the driver circuit 10 is driven low via transistor 19. By controlling P-channel transistor 18 with input portion 12, a fast leading-edge rise time is achieved. By controlling transistor 19 with clock-2, a fast back-edge clock fall time with minimum overlapping of clock edges from separate drive circuits is achieved. Since the input portion 12 only controls p-channel transistor 18, transistor sizes for input portion 12 are implemented in less area.

It should be apparent that although specific N-channel and P-channel MOS transistors are discussed, the present invention may be implemented with other types of transistors and transistors having other conductivities. Although a driver circuit that has an enable, by input signal is described, a driver circuit that is not enabled, by eliminating N-channel transistor 16, and having controlled clock edge characteristics may be implemented. Also, input portion 12 can be further controlled with an addition of series connected transistors, or parallel-connected transistors.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

I claim:

1. A driver circuit with controlled output drive signal characteristics, comprising:

an input means for receiving an input enabling signal at a first control terminal, and receiving a first input clocking signal, the input means selectively providing an output signal in response to both the input enabling signal and the first clocking signal, the enabling signal changing from an inactive state to an active state during a predetermined clock period when the first input clocking signal is inactive, and changing from the active state to the inactive state during a subsequent clock period; and an output means coupled to the input means for receiving both the output signal of the input means and a second input clocking signal, and provides an output drive signal in response to both the output signal of the input means and the second input clocking signal, the second input clocking signal being substantially non-overlapping with the first input clocking signal and being coupled to a second control terminal to force the output drive signal to have a predetermined logic level directly in response to the second input clocking signal.

2. The driver circuit of claim 1 wherein the input means further comprises:

a first transistor of a first conductivity type having a first current electrode coupled to a first power supply terminal, a second current electrode for providing the output signal, and a control electrode coupled to the first input clocking signal;

a second transistor of a second conductivity type having a first current electrode coupled to the second current electrode of the first transistor, a control electrode coupled to the input enabling signal, and a second current electrode;

a third transistor of the second conductivity type having a first current electrode coupled to the second current electrode of the second transistor, a control electrode coupled to the first input clocking signal, and a second current electrode coupled to a second power supply terminal.

3. The driver circuit of claim 1 wherein the output means further comprises:

a first transistor of a first conductivity type having a first current electrode coupled to a first power supply terminal, a second current electrode for providing the output drive signal, and a control electrode coupled to the output signal of the input means; and a second transistor of a second conductivity type having a first current electrode coupled to the second current electrode of the first transistor, a control electrode coupled to the second input clocking signal, and a second current electrode coupled to a second power supply terminal.

4. The driver circuit of claim 3 wherein the first conductivity type is a p-type conductivity.

5. The driver circuit of claim 3 wherein the second conductivity type is an n-type conductivity.

6. A method of controlling output drive signal characteristics of a driver circuit, comprising the steps of:

coupling first, second, and third transistors in series between first and second power supply terminals and coupling control electrodes of the first and third transistors together;

receiving an input enabling signal at a control electrode of the second transistor, and receiving a first input clocking signal at the control electrodes of the first and third transistors to selectively provide an output signal in response to both the input enabling signal and the first clocking signal; and coupling fourth and fifth transistors in series between the first and second power supply terminals, the fourth transistor having a control electrode coupled to the output signal and the fifth transistor having a control electrode coupled to a second input clocking signal, the second input clocking signal being substantially non-overlapping with the first input clocking signal, the fourth and fifth transistors providing an output drive signal with a predetermined logic level directly in response to the second input clocking signal.

7. The method of controlling output drive signal characteristics of a driver circuit of claim 6 wherein the step of receiving the input enabling signal further comprises the input enabling signal changing from an inactive state to an active state when the first input clocking signal is inactive, and the input enabling signal changing from the active state to the inactive state during a subsequent clock period of the first input clocking signal.

8. A driver circuit comprising:

a first transistor of a first conductivity type having a first current electrode coupled to a first power supply voltage terminal, a control electrode coupled to a first clock signal, and a second current electrode;

a second transistor of a second conductivity type having a first current electrode coupled to the second current electrode of the first transistor, a control electrode coupled to an enabling control signal, and a second current electrode;

a third transistor of the second conductivity type having a first current electrode coupled to the second current electrode of the second transistor, a control electrode coupled to the first clock signal, and a second current electrode coupled to a second power supply voltage terminal;

a fourth transistor of the first conductivity type having a first current electrode coupled to the first power supply voltage terminal, a control electrode coupled to the second current electrode of the first transistor, and a second current electrode for providing an output drive signal; and a fifth transistor of the second conductivity type having a first current electrode coupled to the second current electrode of the fourth transistor, a control electrode coupled to a second clock signal, and a second current electrode coupled to the second power supply voltage terminal.

9. The driver of claim 8 wherein the first conductivity type is P and the second conductivity type is N.

10. The driver circuit of claim 8 wherein the first and second clock signals are substantially non-overlapping clock signals.

* * * * *